United States Patent
Boguslavskij et al.

(10) Patent No.: US 8,032,082 B2
(45) Date of Patent: Oct. 4, 2011

(54) AMPLIFIER FOR A RADIO FREQUENCY TRANSMITTER FOR TRANSMITTING A TRANSMIT SIGNAL TO AN OTOLOGICAL APPARATUS

(75) Inventors: Mihail Boguslavskij, Coburg (DE); Jürgen Reithinger, Neunkirchen am Brand (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 683 days.

(21) Appl. No.: 11/827,009

(22) Filed: Jul. 10, 2007

(65) Prior Publication Data

US 2008/0246542 A1    Oct. 9, 2008

(30) Foreign Application Priority Data

Jul. 28, 2006    (DE) .......................... 10 2006 035 006

(51) Int. Cl.
*H04B 1/04*    (2006.01)
(52) U.S. Cl. ...................................... 455/41.1; 455/106
(58) Field of Classification Search .................. 455/41.1, 455/41.2, 42, 44, 91, 106, 108, 112, 130; 375/216, 218, 219; 330/195
See application file for complete search history.

(56) References Cited

U.S. PATENT DOCUMENTS

| | | | | |
|---|---|---|---|---|
| 4,441,210 A | * | 4/1984 | Hochmair et al. | ........... 455/41.1 |
| 5,293,400 A | * | 3/1994 | Monod et al. | ................ 455/41.1 |
| 6,861,811 B2 | | 3/2005 | Buij | |
| 2005/0258899 A1 | * | 11/2005 | Lin | ............................... 330/195 |

FOREIGN PATENT DOCUMENTS

| | | |
|---|---|---|
| DE | 10 2004 001 660 A1 | 8/2005 |
| WO | WO 82/00760 A1 | 3/1982 |

\* cited by examiner

*Primary Examiner* — Thanh Le

(57) ABSTRACT

There is described an amplifier for a radio frequency signal for transmitting a transmit signal to an otological apparatus. The amplifier comprises at least one power transistor for switching an output signal. A breaker gap of the power transistor is actively connected to a network such that a power loss converted in the power transistor is at least partially reduced during a switchover into a switched-on state and/or at least during a switchover into a switched-off state. The breaker gap of the at least one transistor is at least indirectly connected in series to a power supply source by way of a choke coil. The amplifier comprises a transmit coil as an output load, with the transmit coil comprising an inductor and being actively connected to the power transistor. The transmit coil is coupled to the choke coil in a transformer-like manner, with the choke coil thus being able to transmit an output power to the transmit coil. The transmit coil can generate a transmit signal from the output power.

17 Claims, 2 Drawing Sheets

US 8,032,082 B2

AMPLIFIER FOR A RADIO FREQUENCY TRANSMITTER FOR TRANSMITTING A TRANSMIT SIGNAL TO AN OTOLOGICAL APPARATUS

CROSS REFERENCE TO RELATED APPLICATIONS

This application claims priority of German application No. 10 2006 035 006.5 DE filed Jul. 28, 2006, which is incorporated by reference herein in its entirety.

FIELD OF INVENTION

The invention relates to an amplifier for a radio frequency signal for transmitting a transmit signal to an otological apparatus, in particular a class E amplifier. An otological apparatus can be a hearing aid or a tinnitus masker.

BACKGROUND OF INVENTION

In the case of a transmit/receive system, data can be transmitted inductively to communicate between an otological apparatus and an accessory for an otological apparatus, for instance a remote controller or a programming device.

In this case, a transmitter has the task of converting supplied electrical energy into energy of a magnetic alternating field in as efficient a manner as possible. Such a transmit signal is subject to the further requirement for a bandwidth which enables data to be transmitted at a predetermined data rate.

In the case of digital transmit/receive systems, which operate with complex modulation methods, with a PSK method, a BPSK method or a QPSK method for instance (PSK=Phase Key Shifting, BPSK—Binary Phase Key Shifting, QPSK—Quad Phase Key Shifting), such a transmitter of a transmit system is subject to the further requirement that a fast phase change is possible. In linear systems, a time which is required for a phase change, is inversely proportional to a bandwidth of a transmit system.

U.S. Pat. No. 6,861,811 B2 discloses a circuit for lighting electrodeless gas discharge lamps. The circuit comprises a half bridge rectifier having two switching elements which each comprise an emitter electrode and a control electrode. The afore-described switching elements can be switched alternately by means of a resonance control circuit. The resonance control circuit is connected to a class E driver, with the class E driver being coupled on the output side to gate terminals of the two switching elements in a transformer-like manner.

SUMMARY OF INVENTION

An object underlying the invention is to specify an amplifier for a radio frequency signal, which does not feature the aforementioned problems, in particular slow phase behavior.

This object is achieved by an amplifier for a radio frequency signal for transmitting a transmit signal to an otological apparatus, in particular a class E amplifier. An otological apparatus can be a hearing aid or a tinnitus masker for instance.

The amplifier comprises at least one power transistor for switching an output signal. A breaker gap of the power transistor is actively connected to a network such that power loss converted in the power transistor is at least partially reduced at least during a changeover into a switched-on state and/or at least during a changeover into a switched-off state.

The power loss converted in the power transistor is preferably at least partially reduced during a switched-on state and/or a switched-off state. The power loss converted in the power transistor is preferably reduced by at least 30 percent, further preferred by at least 50 percent, particularly preferred by at least 60 percent.

The breaker gap of the at least one transistor is at least indirectly connected in series with a supply voltage source by way of a choke coil. The amplifier comprises a transmit coil as an output load, with the transmit coil comprising an inductor and being actively connected to the power transistor. The transmit coil is coupled to the choke coil in a transformer-like manner, in particular in a coreless transformer-like manner or in a cored transformer-like manner, with the choke coil being able to transmit an output power onto the transmit coil by means of a coupling magnetic field. The transmit coil can generate a transmit signal from the output power. A coupling core of a transformer thus formed is preferably a ferromagnetic core, further preferred a ferrite core.

A coupling factor of the transformer-like coupling achieved by means of the coupling magnetic field is preferably less than 1, for instance in a range between 0.2 und 0.95, further preferred between 0.4 und 0.8. A coupling factor of less than 1 advantageously achieves a sinusoidal pattern of the voltage induced in the transmit coil. Harmonic waves generated in the choke coil can thus be advantageously suppressed.

This circuit arrangement advantageously achieves a rapid phase behavior, in particular by recycling energy in the energy source and non-linear characteristics in the case of a ferromagnetic core of the choke coil.

In a preferred embodiment, the transmit coil is advantageously galvanically separated from the amplifier. This is achieved in particular by means of a galvanically separated transformer-like coupling.

In an advantageous embodiment variant, the transmit coil is actively connected to a tuning impedance. The tuning impedance preferably comprises a capacitor and/or an ohmic resistor.

In a further preferred embodiment variant, the transmit coil is connected to an antenna or a terminal for an antenna. A transmission power, which call be converted in the transmit coil, can herewith be emitted via the antenna.

In a preferred embodiment variant, the output power of the radio frequency amplifier is at least partially determined by a winding ratio, formed from a number of turns of windings of the choke coil and from a number of turns of windings of the transmit coil.

An output power of the thus formed transmitter can advantageously be adjusted in this manner.

In a preferred embodiment, the choke coil is additionally connected in series with an ohmic series resistor, so that an output power of the amplifier is at least partially dependent on the series resistor. An output power of the transmitter formed by means of the amplifier can herewith be advantageously adjusted.

In a preferred embodiment, the amplifier is a transmit amplifier for a radio frequency transmitter of an otological apparatus. An otological apparatus, together with such an amplifier, can efficiently generate a transmit signal for communication with another otological apparatus, for the other ear of a user for instance.

Such a radio frequency transmitter can also advantageously be a component of a programming apparatus or an accessory for an otological apparatus. The programming apparatus for programming an otological apparatus is designed to transmit data to an otological apparatus via a transmit system with the afore-described amplifier.

An exemplary hearing aid with the predescribed amplifier or for connection with the predescribed amplifier comprises at least one sound receiver and a sound generator. The sound receivers are designed in each instance to receive sound waves and to generate a microphone signal, said power signal represents the sound waves received in each instance.

The sound generator is designed to generate a sound as a function of a power signal received on the input side, which corresponds to the power signal.

The exemplary hearing aid also comprises a transmission unit, which is connected on the input side to the sound receivers in each instance and is connected on the output side to the sound generator. The transmission unit is designed to generate a power signal as a function of at least one microphone signal received on the input side, said power signal at least partially representing the at least one microphone signal.

Further advantageous embodiment variants result from the features specified in the dependent claims or a combination thereof.

BRIEF DESCRIPTION OF THE DRAWINGS

The invention is now described below with reference to figures and further exemplary embodiments, in which.

DETAILED DESCRIPTION OF INVENTION

Figure 1:
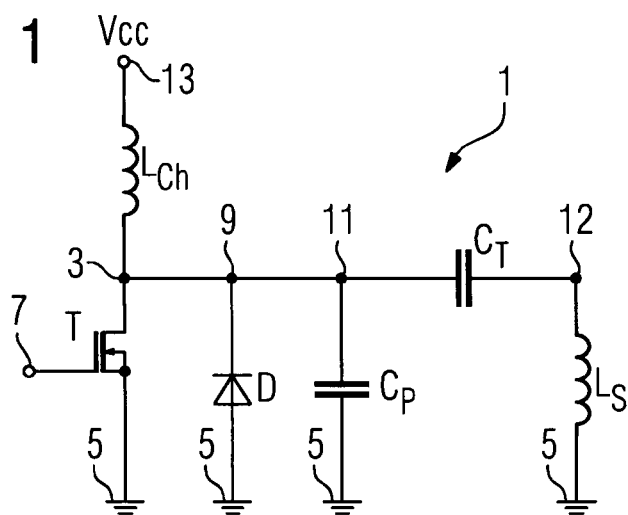
FIG. 1 shows an exemplary embodiment of a conventional class E amplifier.

FIG. 1 shows an exemplary embodiment for a class B amplifier known from the prior art having a transmit coil as an output load.

The amplifier 1 comprises a terminal 13 for a voltage source for supplying the amplifier 1 with electrical energy. The terminal 13 is connected to a first terminal of a choke coil L_Ch. A second terminal of the choke coil L_Ch of the amplifier 1 is connected to a connection node 3. The connection node 3 is connected to a drain terminal of a transistor T. In this embodiment, the transistor T is embodied as a field effect transistor, with a bipolar transistor being able to be provided alternatively herefor.

The transistor T is connected to a source terminal with a ground connection 5. A gate terminal of the transistor T is connected with an input 7 of the amplifier 1 for a control signal. The connection node 3 is connected to a connection node 9 by way of a connecting line. The connection node 9 is connected to a cathode terminal of a diode D. An anode terminal of the diode D is connected to the ground connection 5.

The amplifier 1 also comprises a capacitor C_p, which is connected in parallel to a breaker gap of the transistor T, as a parallel capacitor. The breaker gap is formed between the source terminal and the drain terminal of the transistor T.

The diode D and the capacitor C_p are each connected in parallel to the breaker gap of the transistor T.

The amplifier 1 also comprises a tuning capacitor CT. A first terminal of the tuning capacitor CT is connected to the connection node 11. A second terminal of the tuning capacitor CT is connected to a connection node 12. The connection node 12 is connected to a first terminal of a transmit coil L_S. A second terminal of the transmit coil L_S is connected to the ground connection 5.

The tuning capacitor CT is thus indirectly connected in series with the ground connection 5 by way of the transmit coil L_S The choke coil L_Ch is dimensioned in this exemplary embodiment such that it is placed in a blocking position for the switching frequency for which the amplifier 1 is provided. In this way, power flowing via the transistor T can flow into the connection node 12 to the transmit coil L_S via the connection node 3, the connection node 9, the connection node 11, the tuning capacitor CT, and can be converted there into a magnetic field and/or emitted.

The diode D fulfils a function as a freewheeling diode and is placed in a blocking position during operation of the transistor T. In the event of overvoltages generated when switching the diode D on/off, said diode D can however short circuit through the choke coil and the breaker gap of the transistor T can thus actively protect against overvoltages.

Figure 2:
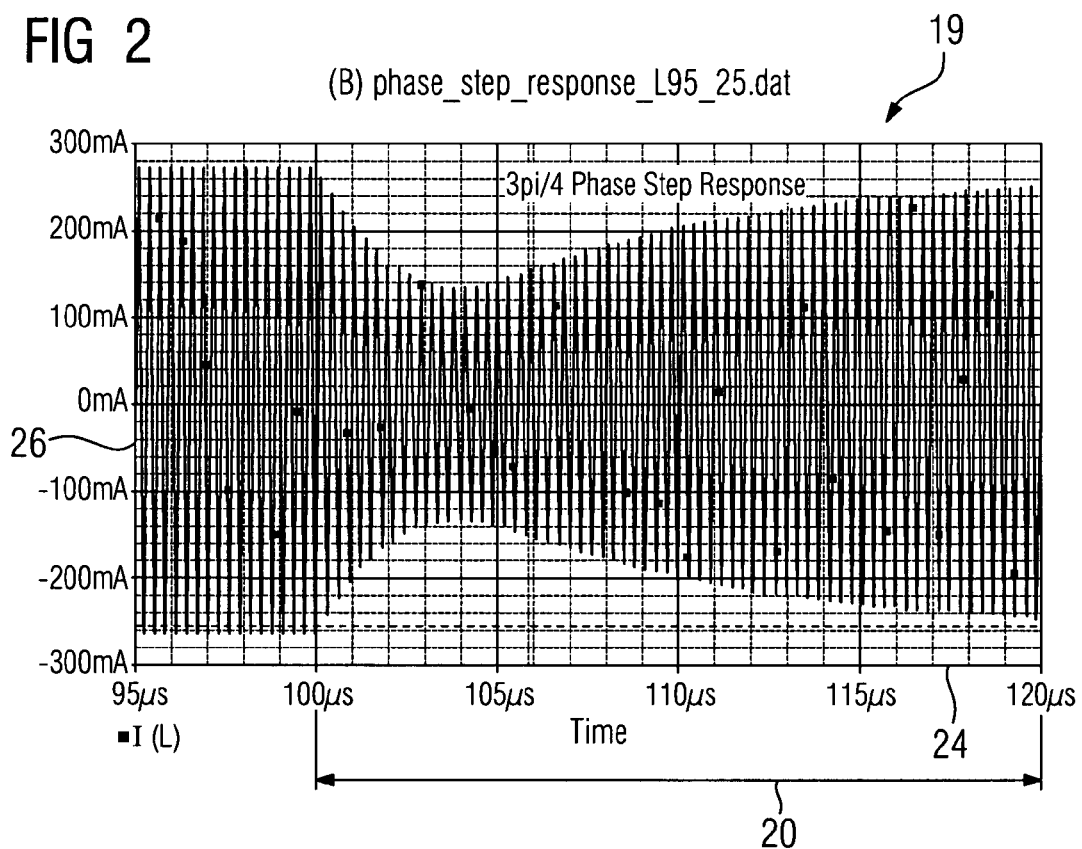
FIG. 2 shows a phase step response of a conventional class E amplifier illustrated in FIG. 1.

FIG. 2 shows a diagram 19. The diagram 19 shows a curve, which represents a current through a transmit coil of the amplifier illustrated in FIG. 1 as a function of time. A time course is plotted on the x-axis 24, in this exemplary embodiment in microseconds. A current through the transmit coil L_S is plotted on the y-axis 26 of diagram 19. A drop in the current through the transmit coil is clearly visible in a time segment 20. A time instant 100 μs on the x-axis 24 represents a phase change. The response of the amplifier 1 to this phase change is clearly visible as a break in the output power of the amplifier, since the current through the transmit coil L_S during the time segment 20 is clearly reduced starting from the phase change at time instant 21 and recovers only slowly.

Figure 3:
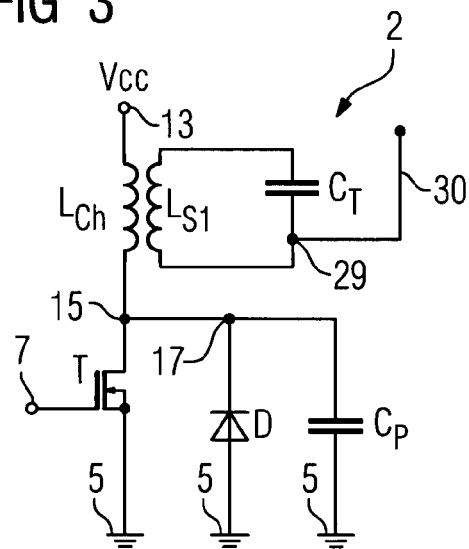
FIG. 3 shows an exemplary embodiment of a class E amplifier according to the invention.

FIG. 3 shows an amplifier 2, which is designed as a class E amplifier. In contrast to the amplifier illustrated in FIG. 1, the amplifier 2 illustrated in FIG. 3 comprises a transmit coil L_S1, which is jointly coupled to a choke coil L_Ch in the amplifier 2 in a transformer-like manner. The amplifier 2 comprises a terminal 13 for a supply voltage source. The terminal 13 is connected to a first terminal of the choke coil L_Ch. A second terminal of the choke coil L_Ch is connected to a connection node 15.

The amplifier 2 also comprises a transistor T. In this exemplary embodiment, the transistor T is designed as a field effect transistor. Other embodiments of a transistor are however also conceivable, in particular a MOS field effect transistor, (MOS—Metal Oxide Semiconductor) or a bipolar transistor. The transistor T comprises a source terminal and a drain terminal. The transistor T also comprises a gate terminal. The transistor T is designed to switch on or switch off a breaker gap of the transistor T, formed between the source terminal and the drain terminal as a function of a potential present at the gate terminal. The source terminal of the transistor T is connected to a ground connection 5. The drain terminal of the transistor T is connected to the connection node 15. The gate terminal of the transistor T forms a control input 7 for the amplifier 2.

The connection node 15 is connected to a connection node 17 by way of a connecting line. The amplifier 2 also comprises a diode D, which, in a manner similar to that of the diode illustrated in FIG. 1, can operate as a freewheeling diode to protect the breaker gap of the transistor T. A cathode terminal of diode D is connected to the connection node 17 and an anode terminal of diode D is connected to the ground connection 5.

A parallel capacitor, formed by a capacitor Cp, is connected in parallel with the diode D such that a first terminal of the capacitor Cp is connected to the connection node 17 and a second terminal of the capacitor Cp is connected to the ground connection 5.

In this exemplary embodiment of the amplifier 2, the choke coil L_Ch is designed to be at least partially conductive in the case of a switching frequency provided to switch the transistor T. In this way, electrical energy in the choke coil L_Ch can be converted into a magnetic field and can be injected into the transmit coil L_S1 in a transformer-like manner. The transmit coil L_S1 is connected in parallel to a tuning capacitor, formed by a capacitor CT, and thus together with the tuning capacitor forms an oscillating circuit. The oscillating circuit comprises a tapping 29, which in this exemplary embodiment is arranged between a terminal of the tuning capacitor CT and a terminal of the transmit coil L_S1.

A transmit power of a transmit signal generated by the transmit coil L_S1 is predetermined by a winding ratio which is formed from a number of turns of transmit coil windings and a number of turns of choke coil windings.

The tapping 29 is connected to an antenna 30. Transmission power injected into the transmit coil L_S1 can thus be effectively emitted by way of antenna 30. In another embodiment, an amplifier 2 provided to transmit data cannot comprise any antennae 30. Such an amplifier can be provided to transmit a transmit signal to a correspondingly arranged receive coil by means of the transmit coil L-S1 using transformer-like coupling.

Figure 4:
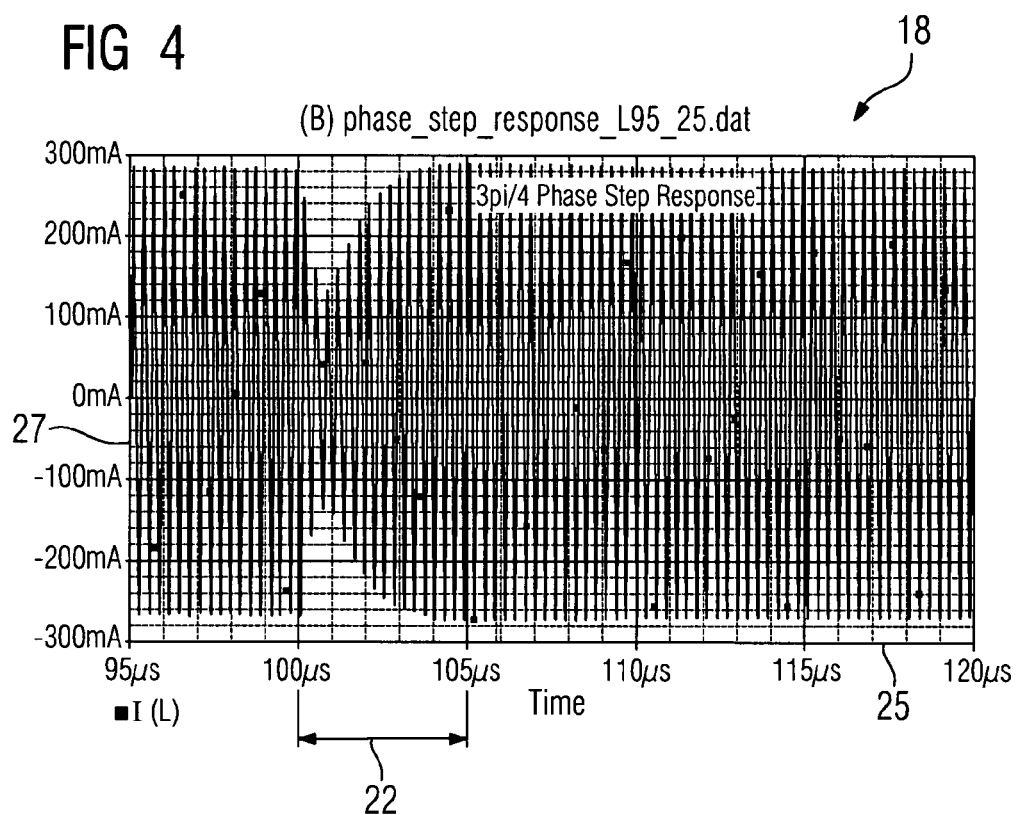
FIG. 4 shows a phase step response of the inventive class E amplifier illustrated in FIG. 3.

FIG. 4 shows a diagram 18. Diagram 18 shows a curve, which represents a current through the transmit coil L_S1 of the amplifier 2 shown in FIG. 3 as a function of time.

Diagram 18 features an x-axis 25, which represents a time course. The diagram also comprises a y-axis 27, which represents a current through the transmit coil L_S1 of the amplifier 2.

A time segment 22 on the x-axis 25 illustrates an interruption in a current through the transmit coil L_S1 caused by a phase change at time instant 100 µs. A rapid recovery of a current through the transmit coil L_S1 is clearly visible, in particular in comparison with the time-dependent current curve illustrated in FIG. 2. The time after which a current through a transmit coil, produced by a phase change after an interruption caused by the phase change assumes an original value, amounts to 20 µs in the case of the amplifier illustrated in FIG. 1 according to the time segment 20 in FIG. 2, whereas a recovery time thus formed, represented by a time segment 22 in diagram 18, only amounts to 5 µs.

The amplifier 2 illustrated in FIG. 3 thus enables, by virtue of the transformer-like coupling of the transmit coil L_S1 to the choke coil L_Ch, a fourfold faster phase change than the amplifier 1 illustrated in FIG. 1.

The invention claimed is:

1. An amplifier for a radio frequency signal for transmitting a transmit signal to an otological apparatus, comprising:
    a power transistor for switching an output signal;
    a breaker gap of the power transistor connected to a network, wherein a power loss converted in the power transistor is at least partially reduced during a switchover into a switched-on state or at least during a switchover into a switched-off state;
    a choke coil, wherein the breaker gap is at least indirectly connected in series with a supply voltage source via the choke coil, and wherein a first terminal of the choke coil is connected to the supply voltage source and a second terminal of the choke coil is connected to a drain terminal of the power transistor; and
    a transmit coil that is not directly connected to the power transistor, wherein the transmit coil is jointly coupled to the choke coil and the choke coil transmits an output power onto the transmit coil.

2. The amplifier as claimed in claim 1, wherein the amplifier is a class E amplifier, and wherein the transmit coil has an inductor.

3. The amplifier as claimed in claim 2, wherein the transmit coil is galvanically separated from the amplifier.

4. The amplifier as claimed in claim 1, wherein the transmit coil is actively connected to a tuning impedance.

5. The amplifier as claimed in claim 4, wherein the tuning impedance has a capacitor and an ohmic resistor.

6. The amplifier as claimed in claim 1, wherein the choke coil is connected in series with an ohmic series resistor, and wherein an output power of the amplifier is at least partially dependent on the ohmic series resistor.

7. The amplifier as claimed in claim 1, wherein the amplifier is provided to transmit the transmit signal to a correspondingly arranged receive coil based upon the transmit coil using a coupling.

8. The amplifier as claimed in claim 1, wherein the amplifier is a transmit amplifier of a radio frequency transmitter of an otological apparatus.

9. The amplifier as claimed in claim 1, wherein the amplifier is a transmit amplifier of a radio frequency transmitter for a programming apparatus for programming an otological apparatus.

10. An amplifier for a radio frequency signal, comprising:
    a power transistor having a breaker gap;
    a transmit coil that is not directly connected to the power transistor; and
    a choke coil, wherein the breaker gap is electrically connectable in series with a supply voltage source via the choke coil, wherein the choke coil is inductively coupled to the transmit coil, and wherein a first terminal of the choke coil is connected to the supply voltage source and a second terminal of the choke coil is connected to a drain terminal of the power transistor.

11. The amplifier as claimed in claim 10, wherein the transmit coil is electrically connected to a tuning impedance.

12. The amplifier as claimed in claim 10, wherein the amplifier is a class E amplifier.

13. The amplifier as claimed in claim 10, wherein the antenna transmits a signal to an otological apparatus.

14. The amplifier as claimed in claim 10, wherein a diode and a capacitor are electrically connected in parallel to the power transistor.

15. A Method for transmitting a phase signal to an otological apparatus, comprising:
    providing an amplifier for a radio frequency signal, having:
        a power transistor having a breaker gap,
        a transmit coil that is not directly connected to the power transistor,
        a choke coil, wherein the breaker gap is electrically connectable in series with a supply voltage source via the choke coil, wherein the choke coil is inductively coupled to the transmit coil, and wherein a first terminal of the choke coil is connected to the supply voltage source and a second terminal of the choke coil is connected to a drain terminal of the power transistor, and
        an antenna; and
    sending a signal of a phase key shifting to the otological apparatus.

16. The method as claimed in claim 15, using a coupling factor between the transmit coil and the choke coil in a range between 0.2 and 0.95.

17. The method as claimed in claim 15, using a coupling factor between the transmit coil and the choke coil in a range between 0.4 and 0.8.

* * * * *